US005895917A

United States Patent [19]
Ueda et al.

[11] Patent Number: 5,895,917
[45] Date of Patent: Apr. 20, 1999

[54] DETECTOR OBJECTIVE LENS

[75] Inventors: Koshi Ueda; Toshimichi Iwai; Gerald Schönecker, all of Munich; Jürgen Frosien, Riemerling, all of Germany

[73] Assignee: ACT Advanced Circuit Testing Gesellschaft fur Testsystementwicklung mbH, Munich, Germany

[21] Appl. No.: 08/877,601

[22] Filed: Jun. 18, 1997

[30] Foreign Application Priority Data

Jul. 25, 1996 [EP] European Pat. Off. ............ 96112017

[51] Int. Cl.$^6$ ............................................. H01J 37/12
[52] U.S. Cl. ................................. 250/310; 250/396 R
[58] Field of Search ......................... 250/310, 396 R, 250/396 ML

[56] References Cited

U.S. PATENT DOCUMENTS 4,769,543 9/1988 Plies ............................ 250/310
4,812,651 3/1989 Feuerbaum et al. .......... 250/310

FOREIGN PATENT DOCUMENTS 0 333018B1 6/1994 European Pat. Off. .

*Primary Examiner*—Kiet T. Nguyen
*Attorney, Agent, or Firm*—Reising, Ethington, Barnes, Kisselle, Learman & McCulloch, P.C.

[57] ABSTRACT

The invention relates to a detector objective lens and a charged particle beam device with such a detector objective lens containing a main lens for focussing a charged particle beam on a specimen, which consists of a magnetic lens (60) and an electrostatic lens (61) and a detector (62) disposed in front of the magnetic lens (60) in the direction of the charged particle beam (2) for detecting the charged particles released at the specimen (8). An additional lens is provided for influencing the released charged particles, which generates an electrostatic and/or magnetic field and is disposed between the main lens and the detector, the fields of the main lens and said additional lens being substantially separated from each other.

27 Claims, 4 Drawing Sheets

Fig.5
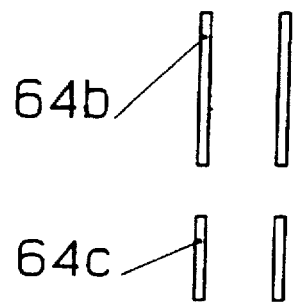
Fig.6
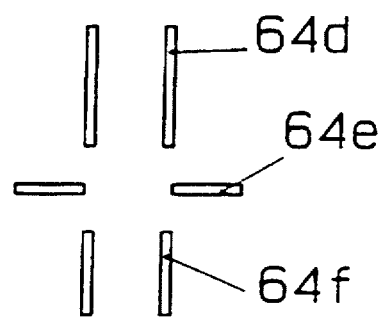
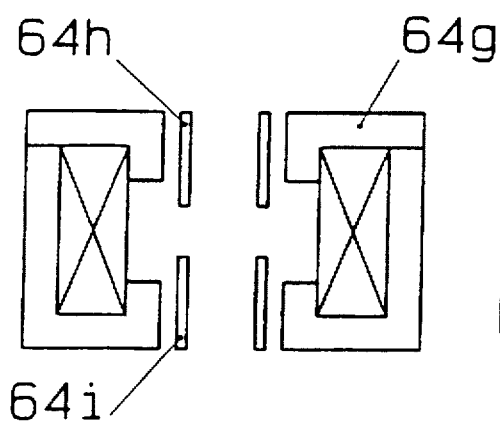
Fig.7

DETECTOR OBJECTIVE LENS

TECHNICAL FIELD

The invention relates to a detector objective lens according to the preamble of claim 1 and to a charged particle beam device according to the preamble of claim 26.

BACKGROUND OF THE INVENTION

A high resolution is required from applications in the low-voltage range, i.e. in the energy range of <5 keV, preferably in the range of 500 eV to 2.5 keV, in particular with regard to the generation of a fine probe. An objective lens is known from EP-B-0 333 018, which can be used in the low-voltage range. The detector is disposed above the lens in this objective lens. The primary charged particles of a high first energy are decelerated to a lower final energy within this objective lens, e.g. down to 500 eV to 2.5 keV. The decelaration field necessary for this is generated by an electrostatic lens disposed within a magnetic lens.

It is true that the electric field strength can be adjusted in the area of the specimen by means of a control electrode disposed between the objective lens and the specimen, however, there is no further possibility of having an influence on the released charged particles. The magnetic field and the electrostatic field of the objective lens are only optimised with respect to the primary charged particle beam in order to obtain good resolution properties. Consequently, the influence of the released charged particles on the way to the detector is automatically determined. However, these conditions are sufficient for many applications.

SUMMARY OF THE INVENTION

Now, the invention is based on the object of further developing the detector objective lens according to the preamble of claim 1 and the charged particle beam device according to the preamble of claim 26 so that the qualitative evaluation of the charged particles released at the specimen is improved.

This object is attained according to the invention by the characterising features of claims 1 and/or 26.

Further developments of the invention are the subject matter of the sub-claims.

An additional lens is provided according to the invention which generates an electrostatic and/or magnetic field for influencing the released charged particles, which is disposed between the main lens and the detector, the fields of the main lens and said additional lens being essentially separated from each other. It is possible in this configuration to act with the main lens on the primary charged particle beam and, substantially independently of this, to act with the field-generating means on the charged particles released at the specimen. Thus, the quality of detection can be clearly improved without having losses in the resolution properties.

BRIEF DESCRIPTION OF THE DRAWINGS

Further advantages and developments of the invention will be explained in greater detail by means of the description of some embodiments and the drawing.

In the drawing

DESCRIPTION OF THE PREFERRED EMBODIMENTS

Figure 1:
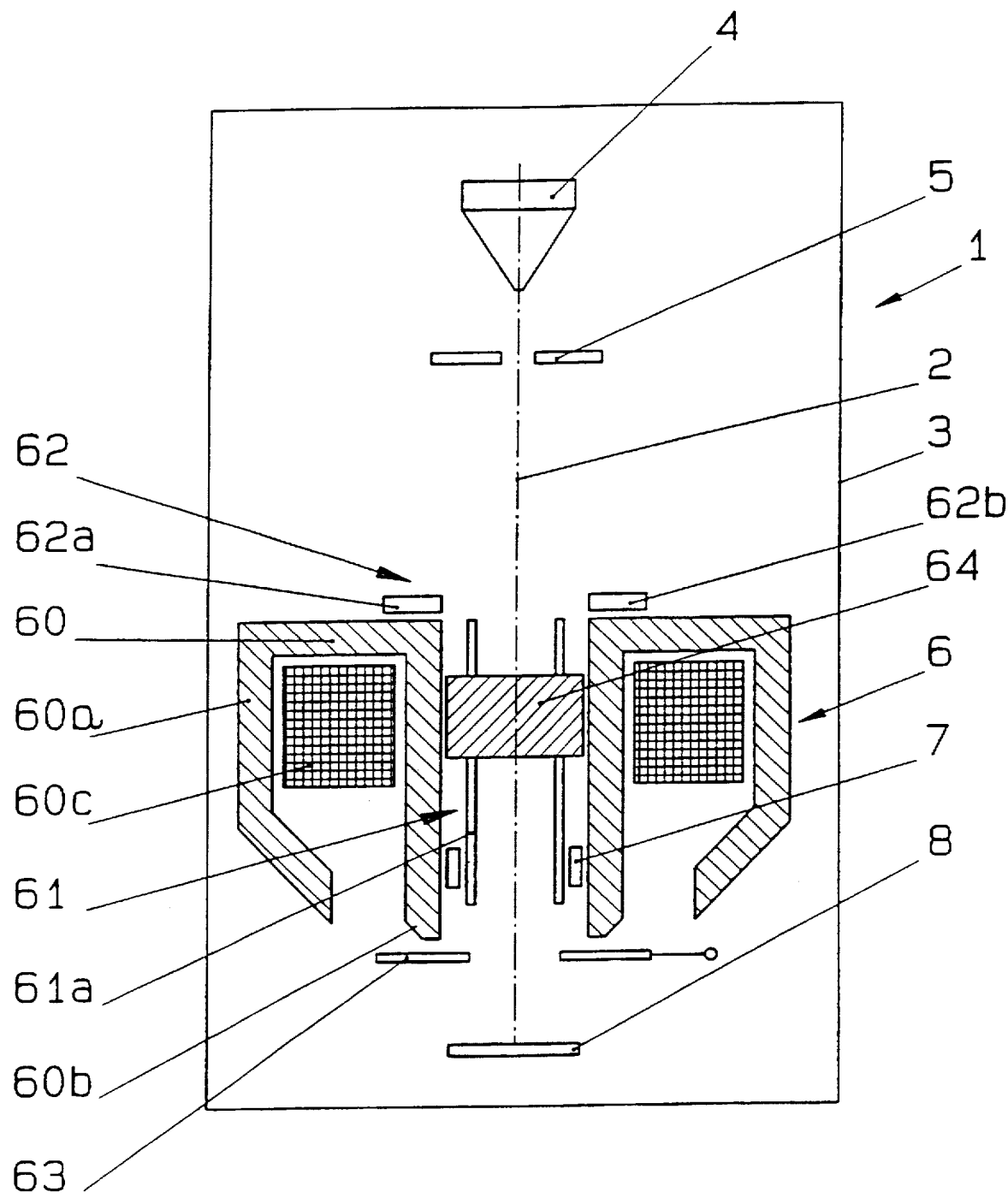
FIG. 1 shows a schematic view of a charged particle beam device according to the present invention, FIG. 2 a schematic view of the fields of the main lens and the additional lens, FIG. 3 a schematic view of a detector objective lens according to a second embodiment, FIG. 4 a schematic view of the additional lens according to a first embodiment, FIG. 5 a schematic view of the according lens to a second embodiment, FIG. 6 a schematic view of the additional lens according to a third embodiment, FIG. 7 a schematic view of the additional lens according to a fourth embodiment, FIG. 8a, 8b a schematic view of the additional lens according to a fifth embodiment and FIG. 9a, 9b a schematic view of the additional lens according to a sixth embodiment.
Figure 8A:
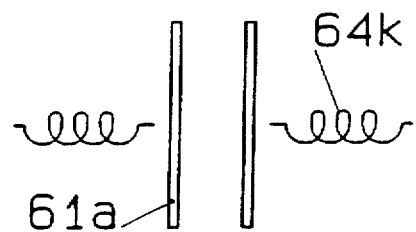
Figure 8B:
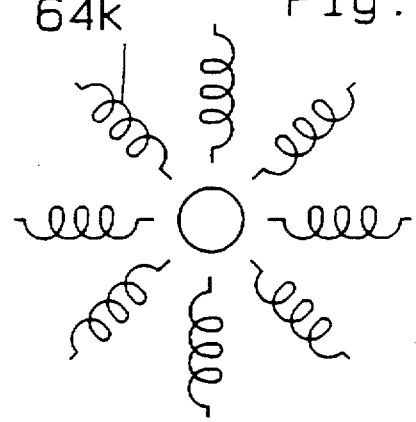

FIG. 1 shows a charged particle beam device, with which a focussed charged particle beam 2, e.g. an electron beam, can be generated in an optical column 3. In addition to a plurality of magnetic and/or electrical lenses and diaphragms (not shown here) for beam formation, the column 3 substantially comprises a source 4 for the generation of the charged particle beam 2 and a detector objective lens. In the represented embodiment a blanking system 5 and a deflection system 7 disposed within the detector objective lens are provided. The charged particle beam 2 generated in the source 4 is focussed on a specimen 8 through the detector objective lens 6.

The detector objective lens 6 having an optical axis consists of a main lens for focussing the charged particle beam 2 on the specimen 8, which consists of a magnetic lens 60 and an electrostatic lens 61 and a detector 62 disposed in front of the magnetic lens in the direction of the charged particle bear 2 for receiving the charged particles release at the specimen 8.

The electrostatic lens 61 is designed as a deceleration lens and has at least two electrodes 61a, 60b which can be supplied with different potentials so that the charged particles of the charged particle beam are decelerated from a first to a lower second energy in the field of the electrostatic lens. In the represented embodiment one of the two electrodes of the electrostatic lens is designed as a beam tube 61a. It consists preferably of a non-conducting material which is provided with a thin, conductive layer at the interior. The second electrode of the electrostatic lens is formed by the lower end of the inner pole piece 60b which is e.g. connected to ground. However, it could also be provided as a separate electrode. This electrode, however, must not be connected to ground, but may also be supplied with a different potential.

The magnetic lens is designed as a single-pole lens here, whose outer pole piece 60a is at least partly shaped conically. An excitation coil 60c is provided to excite the magnetic lens. An additional control electrode 63 is disposed in the optical path between the electrostatic lens 61 and the specimen 8, which is connected to a variable voltage source not represented in greater detail in order to be able to adjust the electrical field strength in the area of the specimen 8. The voltage at the control electrode 63 can e.g. be controlled between −100 V and +100 V.

The deflection system 7 is located between the wall of the inner bore of the magnetic lens 60 and the beam tube 61a.

An additional lens 64 is provided between the main lens 60, 61 and the detector 62 according to the invention, which generates an electrostatic and/or magnetic field for influencing the charged particles released at the specimen. The fields of the main lens 60, 61 and said additional lens 64 are substantially separated from each other. The additional lens is e.g. formed by an electrostatic and/or magnetic lens. Another possibility consists in implementing this additional lens by a multi-pole element with at least six field-generating means.

Depending upon the type and the location of the detector 62, the additional lens 64 may be designed in such a way that it has a diverging, parallelising or converging effect on the charged particles released at the specimen 8.

In the represented embodiment the detector is disposed laterally of the optical axis of the detector lens and comprises two opposite detector elements 62, 62b. Apart from that, the detector is designed in a manner known per se, e.g. with a scintillator or as a secondary charged particle spectrometer.

Figure 2:
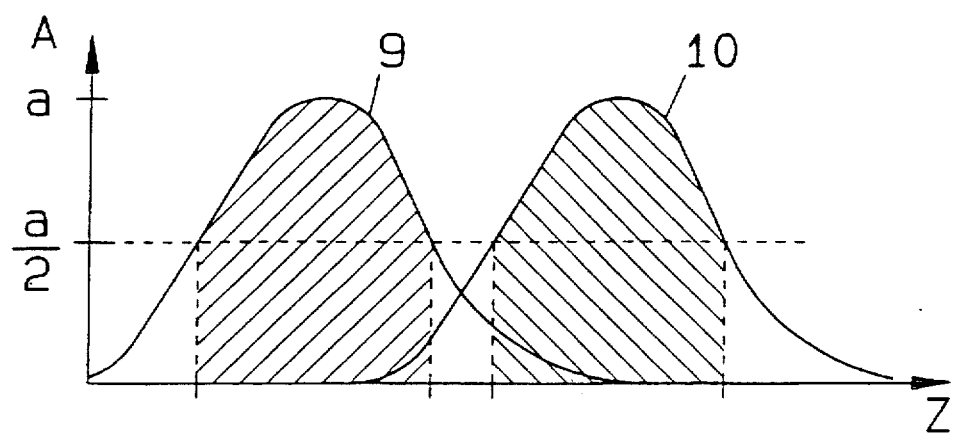

The fields of the main lens 60, 61 and said additional lens 64 are illustrated in z direction, i.e. in the direction of the charged particle beam 2 in FIG. 2. The field distribution of the additional lens 64 is provided with the reference numeral 9 and the field distribution of the main lens is provided with the reference numeral 10. Both field distributions have the same amplitude a in the represented embodiment. Depending upon the design and the application, these amplitudes may, however, also be selected differently.

In order to achieve a separation of the main lens from said additional lens so that, due to this, the primary electron beam and the released charged particles can be influenced independently of each other, the two fields must substantially be separated from each other according to the invention. Within the meaning of the invention it is to be understood that the areas formed by the half-width value (HWFM) of each field distribution 9, 10 and represented in hatched fashion in the drawing do not overlap.

Figure 3:
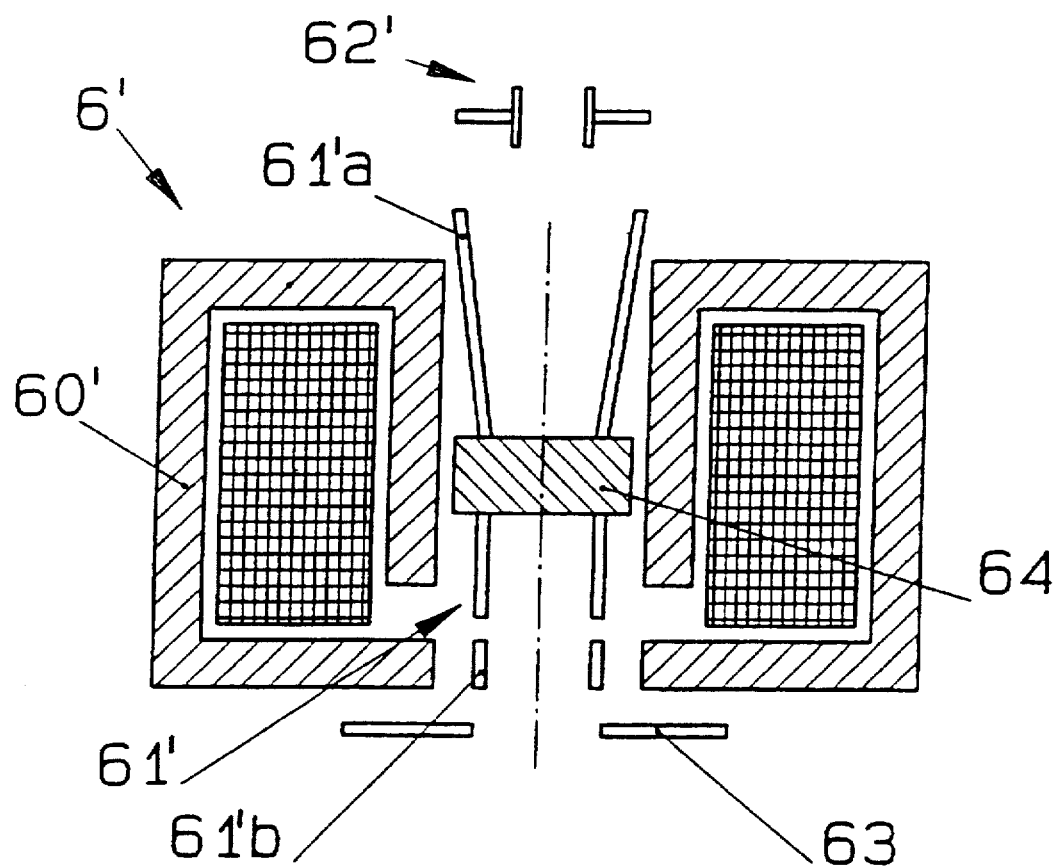

A detector objective lens 6' according to a second embodiment according to the present invention is illustrated in FIG. 3. Here, as well, the main lens consists of a magnetic lens 60' and an electrostatic lens 61'. The magnetic lens 60' is designed here as a two-pole lens in whose interior the electrostatic lens 61' is disposed which comprises a first electrode 61'a and a second electrode 61'b. Both electrodes are designed as a beam tube, the first electrode 61'a being conically enlarged towards the detector 62' in the upper part.

Moreover, control electrode 63 is provided for adjusting the field strength in the area of the specimen.

An additional lens 64 is again disposed between the main lens and the detector to influence the charged particles released at the specimen.

In this embodiment the detector 62' is disposed coaxially to the optical axis of the detector objective 6'. Depending upon the application, the detector may have a segmented detection surface whose output signals can be processed separately from each other.

Various embodiments of the additional lens 64 are explained in greater detail in the following description by means of FIGS. 4 to 9b.

Figure 4:
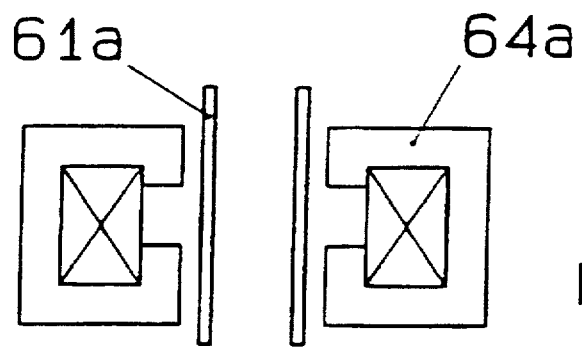

The additional lens is formed by a magnetic lens 64a in FIG. 4 which is disposed outside the beam tube 61a of the main lens.

FIG. 5 shows said additional lens as an electrostatic lens with two electrodes designed as beam tubes 64b, 64c. In the most simple case the beam tube 61a of the electrostatic lens of the main lens is again subdivided in the area of the additional lens 64 in order to thereby form the additional lens. The gap between the electrodes 64b and 64c and the gap between the electrodes 61'a and 61'b of the main lens must, however, be separated from each other spatially to such an extent that the fields of the main lens and of the additional lens are substantially separated form each other.

FIG. 6 also shows an electrostatic lens which has three electrodes 64d, 64e, 64f here, the two outer electrodes being designed as beam tubes 64d, 64f and the central electrode 64e being designed as a plate electrode.

Of course, the additional lens 64 does not only influence the charged particles released at the specimen 8, but also the primary charged particle beam. Due to the position of the additional lens within the detector objective, the final energy of the primary charged particles is, however, exclusively determined by the potential supplied to the electrostatic lens 61 and/or 61' disposed in the main lens. Consequently, the additional lens 64 can be optionally supplied with an arbitrary potential in order to influence the released charged particles, which is optimal regarding type and location of the detector.

If the effect of the additional lens 64 on the primary charged particle beam is considered, the electrodes 64b, 64c of the embodiment shown in FIG. 5 could be supplied with a potential in such a way that they have an accelerating or decelerating effect. In the embodiment represented in FIG. 6 a decelerating effect on the primary charged particles could be adjusted between the electrodes 64d and 64e and an accelerating effect on the primary charged particles could be adjusted between the electrodes 64e and 64f. However, all other combinations, in particular a double decelerating or accelerating effect, are also conceivable.

A combination of the embodiments according to FIGS. 4 and 5 is shown in FIG. 7. Here, a magnetic lens 64g is superimposed with an electrostatic lens consisting of two electrodes 64h and 64i.

However, an influencing of the charged particles released at the specimen 8 may also be implemented by one or several multi-pole elements having at least six field-generating elements. A magnetic multi-pole element is provided in FIGS. 8a, 8b, which comprises eight field-generating elements 64k which are arranged at a uniform distance around the beam tube 61a.

Figure 9A:
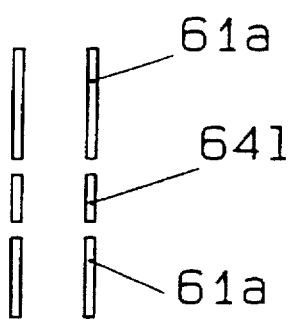
Figure 9B:
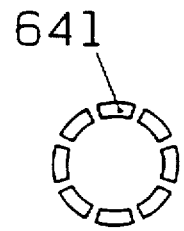

An electrical multi-pole element is represented in FIGS. 9a and 9b, in which eight field-generating elements are formed by electrodes 64l. The electrodes 64l are suitably accommodated in a gap of the beam tube 61a of the main lens. It is conceivable that the part of the beam tube 61a above the electrode 64l is supplied with a potential other than that one of the lower part of the beam tube 61a. In this case, the additional lens 64 would be formed by a superposition of an electrostatic lens consisting of beam tube 61a, electrodes 64l and beam tube 61a and the electric multi-pole element consisting of the electrodes 64l.

The released particles are passing through the detector objective lens in a bundle having a bundle axis which is identical with the optical axis of the detector objective lens. The additional lens influences the released charged particles but not the bundle axis.

The charged particle beam device according to the present invention is distinguished by good resolution properties in the low-voltage range, i.e. at a final energy of the charged particles of less than 5 keV, preferably between 0.5 and 2.5 keV. The free working distance between the lower physical delimitation of the main lens, here the control electrode 63, and the specimen 8, is more than 3 mm, preferably more than 5 mm if a single-pole lens according to FIG. 1 is used. The additional lens 64 permits a defined influence of the charged particles released at the specimen in their direction and energy in order to achieve thereby an optical adaptation to the location and type of the used detector.

We claim:

1. A detector objective lens (6, 6') for a charged particle beam device (1) comprising
   a) a main lens for focussing a charged particle beam on a specimen, which consists of a magnetic lens (60) and an electrostatic lens (61), and
   b) a detector (62) disposed in front of the magnetic lens (60) in the direction of the charged particle beam (2) for detecting charged particles released at the specimen, characterised by an additional lens (64) generating an electrostatic and/or magnetic field for influencing the released charged particles and being disposed between said main lens and said detector, the fields (9, 10) of the main lens and said additional lens being substantially separated from each other.

2. A detector objective lens according to claim 1, characterised in that said additional lens is designed as an electrostatic lens (64b–64f).

3. A detector objective lens according to claim 1, characterised in that said additional lens is designed as a magnetic lens (64a).

4. A detector objective lens according to claim 1, characterised in that said additional lens is designed as an electromagnetic lens (64h, 64g).

5. A detector objective lens according to claim 1, characterised in that said additional lens is formed by a multipole element with at least six field-generating elements (64k; 64l).

6. A detector objective lens according to claim 1, characterised in that said additional lens (64) generates a field which has a diverging effect on the released charged particles.

7. A detector objective lens according to claim 1, characterised in that said additional lens (64) generates a field which has a parallelising effect on the released charged particles.

8. A detector objective lens according to claim 1, characterised in that said additional lens (64) generates a field which has a converging effect on the released charged particles.

9. A detector objective lens according to claim 1, characterised in that the electrostatic lens (61) of the main lens is designed as a decelerating lens.

10. A detector objective lens according to claim 1, characterised in that the electrostatic lens (61; 61') comprises at least two electrodes (61a, 60b; 61'a, 61'b) which can be supplied with different potentials in such a way that the charged particles of the charged particle beam (2) are decelerated from a first to a lower second energy in the field of the electrostatic lens.

11. A detector objective lens according to claim 10, characterised by an additional control electrode (63) which is disposed in the optical path between the electrostatic lens (61, 61') and the specimen (8) and can be supplied with a variable potential for adjusting the electric field strength in the area of the specimen.

12. A detector objective lens according to claim 10, characterised in that one of the two electrodes of the electrostatic lens, is designed as a beam tube (61a, 61'a).

13. A detector objective lens according to claim 12, characterised in that the beam tube (61a, 61'a) consists of a non-conducting material provided with a thin, conductive layer.

14. A detector objective lens according to claim 12, characterised in that the beam tube (61'a) is at least partially shaped conically.

15. A detector objective lens according to claim 1, characterised in that the magnetic lens is designed as a single-pole lens (60).

16. A detector objective lens according to claim 15, characterised in that a free working distance of more than 3 mm, is provided between said main lens and said specimen with a final energy of the charged particles of less than 5 keV.

17. A detector objective lens according to claim 16 characterised in that a free working distance of more than 5 mm is provided between said main lens and said specimen with a final energy of the charged particles being between 0.5 and 2.5 keV.

18. A detector objective lens according to claim 1, characterised in that the magnetic lens (60) of the main lens is shaped conically.

19. A detector objective lens according to claim 1, characterised in that the detector (62') is disposed coaxially to an optical axis of the detector objective lens.

20. A detector objective lens according to claim 1, characterised in that the detector (62) is disposed substantially transversely to the optical axis of the detector objective.

21. A detector objective lens according to claim 1, characterised in that the detector (62, 62') has a segmented detection surface whose output signals can be processed separately from each other.

22. A detector objective lens according to claim 1, characterised in that said additional lens is formed by at least two electrodes, at least one of the two electrodes (64b, 64c, 64d, 64f) being designed as a beam tube.

23. A detector objective lens according to claim 1, characterised in that said additional lens (64) is formed by at least two electrodes (64b, 64c, 64d, 64e, 64f) which can be supplied with different potentials.

24. A detector objective lens according to claim 23, characterised in that the first electrode (64b; 64d), seen in the direction of the charged particle beam, can be supplied with a higher potential than the second electrode.

25. A detector objective lens according to claim 23, characterised in that the first electrode (64b; 64d), seen in the direction of the charged particle beam, can be supplied with a lower potential than the second electrode.

26. A detector objective lens according to claim 1, characterised in that a deflection system (7) for the charged particle beam (2) is provided within the detector objective lens (6).

27. A charged particle beam device (1) comprising
   a) a source (4) for generating a charged particle beam and
   b) a detector objective lens (6; 6') containing
      b$_1$) a main lens for focussing the charged particle beam (2) on a specimen (8), which consists of a magnetic lens (60) and an electrostatic lens (61) and
      b$_2$) a detector (62) disposed in front of the magnetic lens (60) in the direction of the charged particle beam for detecting charged particles released at the specimen (8), characterised by an additional lens (64) generating an electrostatic and/or magnetic field for influencing the released charged particles and being disposed between the main lens and the detector, the fields (9, 10) of the main lens and said additional lens being substantially separated from each other.

* * * * *

UNITED STATES PATENT AND TRADEMARK OFFICE
CERTIFICATE OF CORRECTION

PATENT NO. : 5,895,917
DATED : April 20, 1999
INVENTOR(S) : Koshi Ueda et al

It is certified that error appears in the above-indentified patent and that said Letters Patent is hereby corrected as shown below:

Column 2, line 3, change "according lens to" to -- additional lens according to --; line 32, change "bear" to -- beam --.

Signed and Sealed this

Seventh Day of September, 1999

Attest:

Q. TODD DICKINSON

Attesting Officer

Acting Commissioner of Patents and Trademarks